US005495959A

United States Patent [19]
Rolfson

[11] Patent Number: 5,495,959
[45] Date of Patent: Mar. 5, 1996

[54] METHOD OF MAKING SUBSTRACTIVE RIM PHASE SHIFTING MASKS

[75] Inventor: J. Brett Rolfson, Boise, Id.

[73] Assignee: Micron Technology, Inc., Boise, Id.

[21] Appl. No.: 489,777

[22] Filed: Jun. 13, 1995

Related U.S. Application Data

[63] Continuation of Ser. No. 241,277, May 11, 1994, abandoned.

[51] Int. Cl.[6] ............................................. B44C 1/22
[52] U.S. Cl. ............................................. 216/12; 430/5
[58] Field of Search ............................... 216/12, 75, 77, 216/80; 430/5, 311, 321, 323

[56] References Cited

U.S. PATENT DOCUMENTS

| 5,079,113 | 1/1992 | Ohta et al. | 430/5 |
|---|---|---|---|
| 5,126,220 | 6/1992 | Tokitomo et al. | 430/5 |
| 5,153,083 | 10/1992 | Garofalo et al. | 430/5 |
| 5,194,344 | 3/1993 | Cathey et al. | 430/5 |
| 5,194,345 | 3/1993 | Rolfson | 430/5 |
| 5,194,346 | 3/1993 | Rolfson et al. | 430/5 |
| 5,208,125 | 5/1993 | Lowrey et al. | 430/5 |
| 5,217,830 | 6/1993 | Lowrey | 430/5 |
| 5,225,035 | 7/1993 | Rolfson | 156/643 |
| 5,240,796 | 8/1993 | Lee et al. | 430/5 |
| 5,281,500 | 1/1994 | Cathey et al. | 430/5 |
| 5,288,568 | 2/1994 | Cathey, Jr. | 430/5 |
| 5,290,647 | 3/1994 | Miyazaki et al. | 430/5 |
| 5,292,623 | 3/1994 | Kemp et al. | 430/313 |

FOREIGN PATENT DOCUMENTS

| 3-172845 | 7/1991 | Japan | G03F 1/08 |
|---|---|---|---|

OTHER PUBLICATIONS

Lin, Burn J., "Phase Shifting and Other Challenges in Optical Mask Technology", IBM-EF-15 (Sep. 26, 1990).

Primary Examiner—George Fourson
Assistant Examiner—Thomas G. Bilodeau
Attorney, Agent, or Firm—Stephen A. Gratton

[57] ABSTRACT

An improved method for fabricating phase shifting masks suitable for semiconductor manufacture is provided. A photolithographic mask blank comprising a transparent substrate having an opaque layer of a standard thickness is provided. Using a photoresist mask, the opaque layer is patterned and etched with openings to form opaque light blockers. The substrate under the openings is then etched to a predetermined depth using the same photoresist mask or the opaque layer as a hard mask. A phase shift material, such as silicon dioxide, is then deposited over the opaque light blockers and into the openings to form rim phase shifters on the sidewalls of the light blockers and light transmission areas in the openings. The depth of the etch into the substrate and the thickness of the opaque layer determines the amount of the phase shift. These parameters are controlled to achieve a phase shift of 180° or odd multiple thereof.

18 Claims, 2 Drawing Sheets

METHOD OF MAKING SUBSTRACTIVE RIM PHASE SHIFTING MASKS

This invention was made with Government support under Contract No. MDA972-92-C-0054 awarded by Advanced Research Projects Agency (ARPA). The Government has certain rights in this invention.

This is a continuation of application Ser. No. 08/241,277 filed May 11, 1994, now abandoned.

FIELD OF THE INVENTION

This invention relates to optical lithography and more particularly to the fabrication of masks or reticles which are used in optical lithography. The method of the invention is particularly suited to the fabrication of phase shifting masks for semiconductor manufacture.

BACKGROUND OF THE INVENTION

In semiconductor manufacture, micro lithography is used in the formation of integrated circuits on a semiconductor wafer. During a lithographic process, a form of radiant energy such as ultraviolet light, is passed through a mask or reticle and onto the semiconductor wafer. The mask contains opaque and transparent regions formed in a predetermined pattern. A grating pattern, for example, may be used to define parallel spaced conducting lines on a semiconductor wafer. The ultraviolet light exposes the mask pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

As microcircuit densities have increased, the size of the features of semiconductor devices have decreased to the sub micron level. These sub micron features may include the width and spacing of metal conducting lines or the size of various geometric features of active semiconductor devices. The requirement of sub micron features in semiconductor manufacture has necessitated the development of improved lithographic processes and systems. One such improved lithographic process is known as phase shift lithography.

With phase shift lithography the interference of light rays is used to overcome diffraction and improve the resolution and depth of optical images projected onto a target. In phase shift lithography, the phase of an exposure light at the object is controlled such that adjacent bright areas are formed preferably 180 degrees out of phase with one another. Dark regions are thus produced between the bright areas by destructive interference even when diffraction would otherwise cause these areas to be lit. This technique improves total resolution at the object and allows resolutions as fine as 0.25 μm to occur.

In general, a phase shifting photomask is constructed with a repetitive pattern formed of three distinct layers or areas. An opaque layer provides areas that allow no light transmission, a transparent layer provides areas which allow close to 100% of light to pass through and a phase shift layer provides areas which allow close to 100% of light to pass through but phase shifted 180 degrees from the light passing through the transparent areas. The transparent areas and phase shift areas are situated such that light rays diffracted through each area is canceled out in a darkened area there between. This creates the pattern of dark and bright areas which can be used to clearly delineate features of a pattern defined by the opaque layer of the mask on a photopatterned semiconductor wafer.

Recently, different techniques have been developed in the art for fabricating different types of phase shifting photomasks. One type of phase shifting mask, named after a pioneer researcher in the field, M. D. Levenson, is known in the art as a "Levenson" phase shifting mask. This type of mask is also referred to as an "alternating aperture" phase shifting mask because opaque light blockers alternate with light transmission apertures and every other aperture contains a phase shifter.

This type of mask is typically formed on a transparent quartz substrate. An opaque layer, formed of a material such as chromium, is deposited on the quartz substrate and etched with openings in a desired pattern. Phase shift areas on the mask are formed by depositing a phase shift material over the opaque layer and into every other opening in the opaque layer. This is termed an "additive" phase shifting mask. Alternately, phase shift areas of the mask may be formed in areas of the quartz substrate having a decreased thickness. This is termed a subtractive phase shifting mask.

Two types of Levenson phase shifting photomasks are shown in FIGS. 1A and 1B. FIG. 1A shows an additive phase shifting mask 8 comprising a transparent substrate 10 and an opaque layer 12 having a pattern of etched openings 16. The phase shifters 14 for the phase shifting mask 8 are formed as segments of a light transmissive material, such as $SiO_2$, deposited in every other opening 16 in the opaque layer 12.

FIG. 1B shows a subtractive phase shifting mask 8A. In a subtractive phase shifting mask 8A, the phase shifters 14A are formed by etching the substrate 10A aligned with every other opening 16A in the opaque layer 12A. In the subtractive phase shifting mask 8A, the unetched portions of the substrate form the phase shifters 14A. Although the additive and subtractive phase shifting masks are fabricated by different methods, the operation of these photomasks is equivalent.

Another type of phase shifting photomask is known as a rim phase shifting mask. A rim phase shifting mask includes phase shifters that are formed on the edges of the opaque light blocking elements. U.S. Pat. No. 5,194,345 to J. Brett Rolfson, also the present Applicant, discloses a rim phase shifting photomask. A rim phase shifting mask 18, fabricated in accordance with the '345 patent, is shown in FIG. 2. The phase shifting mask 18 includes a transparent substrate 20 having a pattern of opaque light blockers 22 formed thereon. Between each opaque light blocker 22 is a light transmission opening 24. The pattern formed by the opaque light blockers 22 and the light transmission openings 24, establishes the image that is projected by the phase shifting mask 18 onto a wafer during a photolithography process.

In the rim phase shifting mask 18, a layer of a transparent phase shift material 26, such as $SiO_2$, is conformally deposited over the opaque light blockers 22 and into the light transmission openings 24. This produces rim phase shifters 28 on the sidewalls of the opaque light blockers 22 on either side of each light transmission opening 24. In use of the phase shifting mask 18, the light passing through a rim phase shifter 28 is phase shifted relative to the light passing through a light transmission opening 24. This is because the light passing through a rim phase shifter 28 must pass through a thicker section of the transparent phase shift material 26. The phase shifted light forms a null on the wafer that corresponds to the edges of the opaque light blockers 22. This overcomes the effects of diffraction along the edges of the opaque light blockers 22 and produces a sharpened image.

In the '345 patent, the thickness "t" of the opaque light blockers 22 is selected to form rim phase shifters 28 that achieve a phase shift of 180° (π) or an odd whole multiple of 180°. This thickness "t" can be determined using the formula:

$$t = i\lambda/2(n-1)$$

where t=thickness of opaque light blockers
i=an odd integer
λ=wavelength of exposure light
n=refractive index of phase shift material
at the exposure wavelength.

Although this is an effective method for establishing the thickness of a rim phase shifter, it may be difficult to form the opaque layer to the required thickness (t) without employing custom fabrication processes. Specifically, standard mask blanks employed in semiconductor manufacture, are difficult to use with this method because the opaque layer on these masks is not formed to the required thickness "t".

Standard mask blanks are manufactured and sold by mask makers for use in semiconductor manufacture. These mask blanks include a transparent substrate and an opaque layer deposited and planarized to a standard thickness (e.g., 800–1200 Å). The opaque layer is then patterned and etched with a particular integrated circuit layout for use in the semiconductor manufacturing process. The thickness of the opaque layer on a standard mask blank, is established without regard to achieving a phase shift, as taught in the '345 patent.

Because it is difficult to modify the existing opaque layer of a standard mask blank to a different thickness, a standard mask blank can not be used in forming a phase shifting mask under the method disclosed in the '345 patent. Accordingly this type of phase shifting mask must be custom fabricated. This may be an expensive and time consuming process.

In view of the foregoing it is an object of the present invention to provide an improved method for fabricating rim phase shifting masks for semiconductor manufacture. It is a further object of the present invention to provide an improved method for fabricating rim phase shifting masks in which standard mask blanks can be employed to facilitate the fabrication process. It is yet another object of the present invention to provide an improved method for fabricating rim phase shifting mask that is simple, low cost and adaptable to large scale semiconductor manufacture.

SUMMARY OF THE INVENTION

In accordance with the present invention an improved method of fabricating a rim phase shifting mask is provided. The method of the invention includes the steps of: providing a mask blank comprising a transparent substrate with an opaque layer; etching the opaque layer with a pattern of openings to the substrate to form opaque light blockers and light transmission openings; etching the substrate under the openings to a predetermined depth; and then depositing a phase shift material over the opaque layer and into the openings to form rim phase shifters on the sidewalls of the opaque light blockers.

The method of the invention can be performed using a standard mask blank having an opaque layer formed to any thickness. The depth of the etch into the substrate, along with the initial thickness of the opaque layer, determines the thickness of the rim phase shifters and thus the amount of phase shift. Stated differently, the depth of the etch is controlled to establish a required distance from the etched substrate to the top of the opaque layer to achieve a desired phase shift. Etching of the substrate is self aligning because the same resist mask that is used to pattern the opaque layer may be used to etch the substrate.

Other objects, advantages and capabilities of the present invention will become more apparent as the description proceeds.

DETAILED DESCRIPTION OF THE PREFERRED EMBODIMENT

Referring now to FIGS. 3A–3D the steps involved in fabricating a phase shifting photomask in accordance with the invention are shown.

Figure 1A:
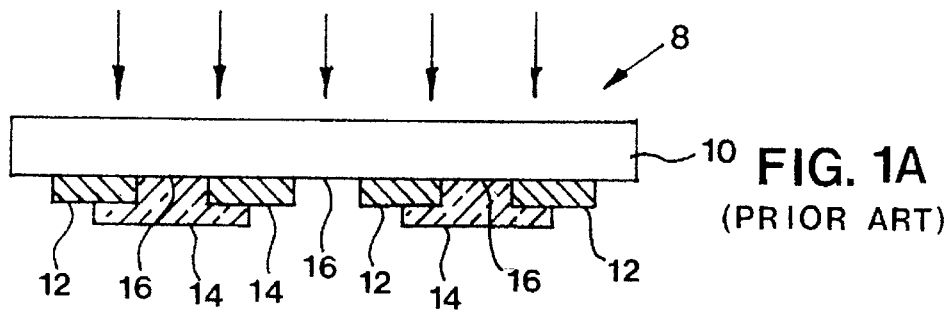
FIG. 1A is a cross sectional view of a prior art phase shifting mask constructed with an additive process.
Figure 1B:
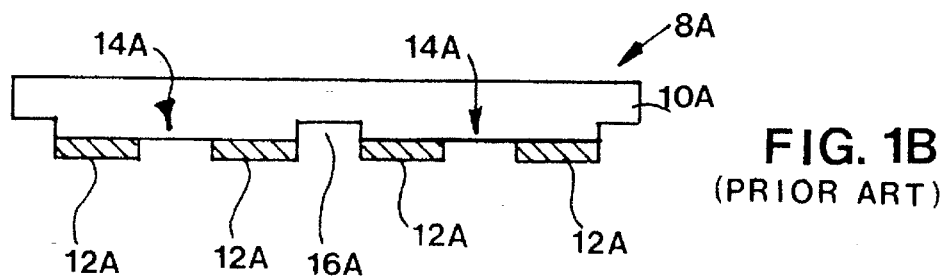
FIG. 1B is a cross sectional view of a prior art phase shifting mask constructed with a subtractive process.
Figure 2:
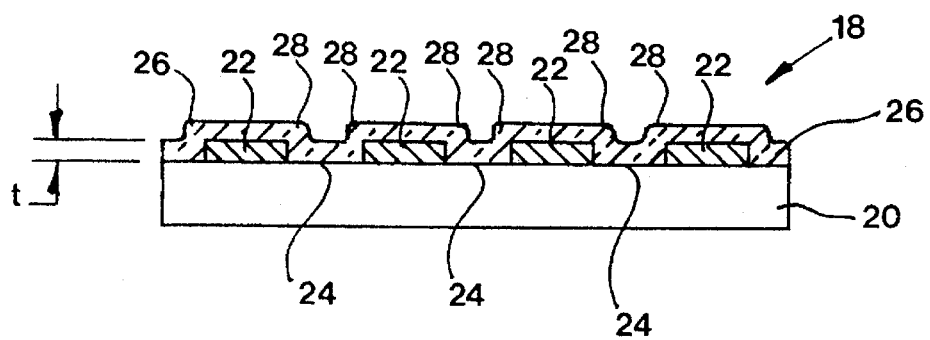
FIG. 2 is a cross sectional view of a prior art rim phase shifting mask constructed in accordance with U.S. Pat. No. 5,194,345.
Figure 3A:
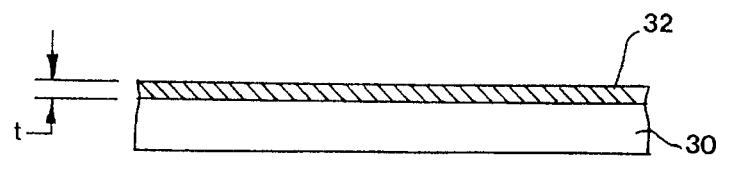
FIGS. 3A–3D are cross sectional views illustrating the steps involved in fabricating a rim phase shifting mask in accordance with the present invention.

As shown in FIG. 3A, a transparent quartz substrate 30 includes an opaque layer 32. The substrate 30 may be formed of any transparent material having suitable optical and mechanical properties. Quartz is favored for the substrate 30 because it is highly transparent and is not affected by temperature variations that may produce pattern distortions during the photolithography exposure and alignment steps.

The opaque layer 32 is formed on the substrate 30 to a thickness of "t". The opaque layer 32 may be formed as a metallized layer out of a material such as chromium, aluminum, tungsten, gold, iron oxide or other metals. These metals are opaque to most exposing wavelengths and are characterized by mechanical properties that are suitable for plating.

Advantageously, the quartz substrate 30 and opaque layer 32 may be formed as a photolithographic mask blank in a separate manufacturing process. Such a mask blank is referred to as a "standard" binary mask blank. The thickness "t" of the opaque layer 32 for a standard mask blank will typically be on the order of about 800–1200 Å.

Figure 3B:
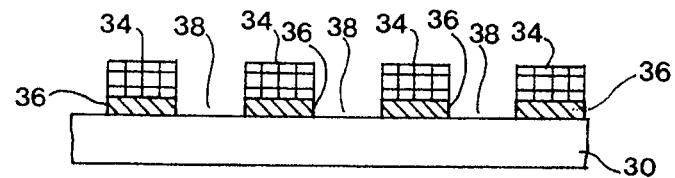

Next, as shown in FIG. 3B, a layer of photoresist is deposited on the opaque layer 32 and patterned to form a photoresist mask 34. The opaque layer 32 is then etched through the photoresist mask 34 to form a pattern of openings 38 and opaque light blockers 36. Each opaque light blocker 36 preferably has sidewalls that extend from the surface of the substrate 30 in a generally vertical direction. This structure can be achieved using an anisotropic dry etch process to etch the opaque layer 32 through to the substrate 30. Suitable dry etchants for a metallized opaque layer include chlorine and fluorine based compounds. State of the art wet etch techniques would also be suitable.

Figure 3C:
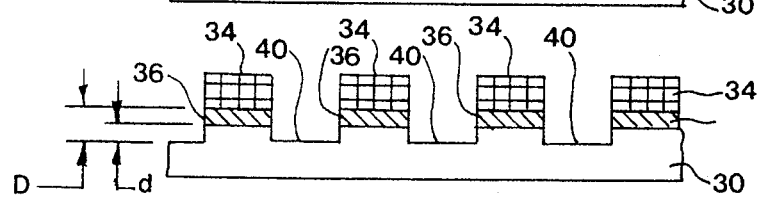

Next, as shown in FIG. 3C, the quartz substrate 30 in alignment with the openings 38 in the opaque layer 34, is etched back to a depth of "d" from the surface of the substrate 30 to form etched substrate surfaces 40 in each of the openings 38. For a quartz substrate this etch back can be performed using a dry plasma etch process. Suitable etchant species for etching quartz include fluorine-based chemistries (e.g., $CHF_3$). The depth "d" of the etch into the surface of the substrate 30, is controlled such that the total distance "D" measured from the etched substrate surface 40 to the upper surface of the opaque light blockers 36 has a predetermined value. The total distance "D" is equal to the depth "d" of the etch into the substrate and the thickness "t" of the opaque light blockers 36 (D=d+t). As will be more fully explained, this total distance "D" will determine the amount of the phase shift in the completed rim phase shifters.

During the etch back of the substrate 30, the opaque light blockers 36 are protected by the photoresist mask 34. In addition, the etch back step is self aligning with the openings 38 because the same photoresist mask 34 that was used to initially etch the openings 38 in the opaque layer 32 can also used to form the etched substrate 40. Alternatively, the photoresist mask 34 could be stripped prior to etch of the substrate 30 and the opaque layer 32 used as an etch hardmask.

Following the etching of the substrate 40, the photoresist mask 34 is removed. (If, however, the opaque layer 32 is used as a hard mask, the photoresist mask 34 is stripped prior to etching of the substrate 30.) Removing the photoresist mask 34 may be by using either a wet chemical stripping process or a dry plasma etch process. For a wet chemical stripping process the wet chemicals can be selected to remove the photoresist mask 34 without affecting the metallized opaque layer 36 or the quartz substrate 30. Suitable wet chemical strippers include phenolic organic strippers, chromic and sulfuric acid mixtures, and solvent strippers.

Figure 3D:
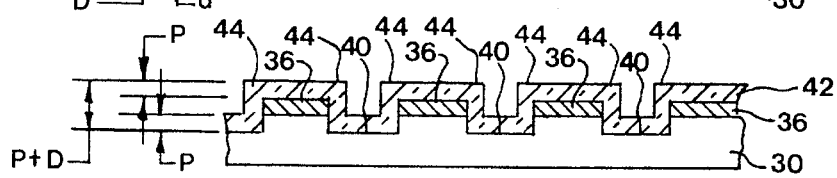

Next, as shown in FIG. 3D, a phase shift material 42 is conformally deposited over the opaque light blockers 36, into the openings 38 between the opaque light blockers 36 and over the etched substrate 40. The phase shift material 42 also conforms to the sidewalls of the opaque light blockers 36. The phase shift material 42 may be any transparent material that has an index of refraction for light that is different than the index of refraction for light with air. One suitable phase shift material 42 is silicon dioxide ($SiO_2$). Another suitable phase shift material 42 is silicon nitride ($Si_3N_4$). These materials may be conformally blanket deposited using a vacuum deposition process such as evaporation or chemical vapor deposition.

As shown in FIG. 3D, the phase shift material 42 may be conformally deposited with a thickness of "P". Such a conformal blanket deposition produces rim phase shifters 44 on the sidewalls of each opaque light blocker 36. Each rim phase shifter 44 is characterized by a thickness of "D"+"P". This thickness is measured from the etched substrate 40 to the topmost surface of the phase shift material 42. A width of the phase shifters 44 measured from an edge of the phase shift material 42 to a sidewall of an opaque light blocker 36 is equal to "P" the thickness of the phase shift material 42. This geometry may be achieved by an accurate conformal deposition of the phase shift material 42.

The openings 38 between the opaque light blockers 36, covered with the phase shift material 42, form the light transmission openings of the phase shift mask. With a conformal deposition of phase shift material 42, each opening 38 is covered with phase shift material 42 to a thickness of "P" measured from the etched substrate 40 to a top surface of the phase shift material 42 within the opening 38. Incident light passing through a light transmission opening 38 must, therefore, travel a distance of "P" through the phase shift material 42. The phase shifters 44, on the other hand, have a thickness of "P"+"D". Incident light passing through a rim phase shifters 44 must therefore travel a distance of "P"+"D" through the phase shift material 42. This difference in the thickness of the phase shift material 42 on the light transmission openings 38 and the phase shifters 44 ("P" versus ("P"+"D")) produces a relative phase shift of preferably 180° ($\pi$) or whole multiple thereof.

The distance "D" between the etched substrate surface 40 and the topmost surface of the opaque layer 32 thus ultimately determines the thickness of the phase shifters 44. An optimal "D" for achieving a 180° ($\pi$) phase shift (or whole multiple thereof) may be determined using the previously recited formula $t=i\lambda/2(n-1)$. In this analysis, "D" is now equivalent to "t" in the '345 patent. The thickness P of the phase shift material 42 does not apply in this equation because the light transmission openings 38 and the phase shifters 44 both include this thickness of phase shift material 42.

Figure 4:
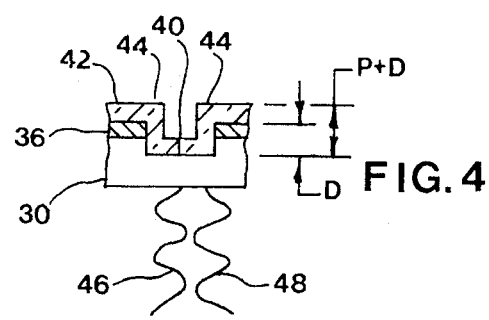
FIG. 4 is a diagrammatic representation of a portion of a rim phase shifting mask fabricated in accordance with the invention showing the phase shifting of light rays passing through a rim phase shifter with respect to light passing through an adjacent light transmission opening.

The operation of the phase shifters 44 relative to the light transmission openings 40 is shown in FIG. 4 for a 180° ($\pi$) phase shift. In FIG. 4, the 180° ($\pi$) phase shift of light passing through a light transmission opening 38 versus light passing through a rim phase shifter 44 is illustrated with light waves 46 and 48. Light wave 46 passing through the phase shifter 44 must travel the distance of "D" through the phase shift material 32 relative to light passing through a light transmission opening 38. Travel through this additional phase shift material 42 causes a phase shift of 180° ($\pi$) between the light waves 46 and 48.

Thus the invention provides an improved method for fabricating phase shift reticles adapted for use in semiconductor photolithographic processes. While the method of the invention has been described with reference to a preferred embodiment, as will be apparent to those skilled in the art, certain changes and modifications can be made without departing from the scope of the invention as defined by the following claims.

What is claimed is:

1. A method for forming a rim phase shifting mask for semiconductor manufacture comprising:

forming an opaque layer having a thickness of "t" on a transparent substrate;

forming a mask on the opaque layer;

etching openings through the opaque layer to the substrate using the mask to form a pattern of opaque light blockers having sidewalls;

etching the substrate aligned with the openings to a depth of "d";

removing the mask; and forming phase shifters on the sidewalls of the opaque light blockers and light transmission openings in the openings by conformally depositing a transparent phase shift layer over the opaque light blockers and the sidewalls and over the etched substrate into the openings to a thickness of "P";

said phase shift layer not being etched and remaining in said light transmission openings, such that said rim phase shifters have a width of "P" and a thickness of "t"+"d"+"P" with "t" and "d" selected for establishing a phase shift for light passing through a rim phase shifter relative to light passing through a light transmission opening.

2. The method as recited in claim 1 and wherein the mask is removed prior to etching the substrate and the opaque layer is used as a hard mask for etching the substrate.

3. The method as recited in claim 1 and wherein the thickness "t" of the opaque layer and depth "d" of the etched substrate are selected to form rim phase shifters adapted to provide a phase shift of approximately 180° times an odd integer.

4. The method as recited in claim 1 and wherein the substrate and opaque layer are formed as a mask blank.

5. The method as recited in claim 1 and wherein the phase shift material is selected from the group of materials consisting of silicon dioxide and silicon nitride.

6. The method as recited in claim 1 and wherein the opaque material is selected from the group of materials consisting of chromium, aluminum, tungsten, gold, and iron oxide.

7. A method for forming a rim phase shifting mask for semiconductor manufacture comprising:

forming an opaque layer having a thickness of "t" on a transparent substrate;

depositing and patterning a layer of photoresist on the opaque layer and etching openings through the opaque layer to the substrate to form a pattern of opaque light blockers having sidewalls;

removing the photoresist;

etching the substrate aligned with the openings to a depth of "d";

forming phase shifters on the sidewalls of the opaque light blockers and light transmission openings in the openings by conformally depositing a transparent phase shift material over the opaque layer and openings to a thickness of "P";

said phase shift material not being etched and remaining in said light transmission openings and on the sidewalls to a thickness of "P"; and selecting "t" and "d" to form the rim phase shifters so that light passing through the rim phase shifters travels a distance through the phase shift material of "t"+"d"+"P" and is phase shifted relative to light passing through the light transmission openings which travels a distance through the phase shift material of "P".

8. The method as recited in claim 7 and wherein the substrate and opaque layer are formed as a mask blank.

9. The method as recited in claim 8 and wherein t and d are selected using the formula $t+d=i\lambda/2(n-1)$ where
t=thickness of opaque layer d=depth of etch
i=an odd integer
$\lambda$=wavelength of exposure light
n=refractive index of phase shift material at the exposure wavelength.

10. The method as recited in claim 8 and wherein the photoresist is not removed until after the substrate is etched.

11. The method as recited in claim 8 and wherein the photoresist is removed prior to etching the substrate and the opaque layer is used as a hard mask for etching the substrate.

12. The method as recited in claim 8 and wherein the substrate is quartz and the opaque layer is chrome.

13. A method for forming a rim phase shifting mask for semiconductor manufacture comprising:

providing a mask blank comprising a transparent substrate with an opaque layer having a thickness of "t";

depositing and patterning a layer of photoresist on the opaque layer and etching openings through the opaque layer to the substrate to form a pattern of opaque light blockers having sidewalls;

etching the substrate in alignment with the openings to a depth of "d";

removing the photoresist;

forming phase shifters on the sidewalls of the opaque light blockers and light transmission openings in the openings by conformally depositing a transparent phase shift layer over the opaque layer and onto the etched substrate to a thickness of "P"; said rim phase shifters self aligned with the sidewalls and having a width of "P" and a thickness measured from a surface of the etched substrate to a surface of the phase shift layer of "t"+"d"+"P"; and said phase shift layer not being etched and remaining in said light transmission openings to achieve a phase shift for light passing through a rim phase shifter relative to light passing through a light transmission opening.

14. The method as recited in claim 13 and wherein the photoresist is removed prior to etching the substrate and the opaque layer is used as a hard mask for etching the substrate.

15. The method as recited in claim 13 and wherein the opaque layer is a material selected from the group of materials consisting of chromium, aluminum, tungsten, gold, and iron oxide.

16. The method as recited in claim 13 and wherein the opaque layer has a thickness of between about 800–1200 Å.

17. The method as recited in claim 13 further comprising directing light through the substrate onto a wafer in a photolithography process to produce light canceling along a rim of a pattern defined by the opaque light blockers.

18. The method as recited in claim 13 and wherein the substrate is quartz, the opaque layer is chromium and the phase shift material is silicon dioxide.

* * * * *

UNITED STATES PATENT AND TRADEMARK OFFICE
CERTIFICATE OF CORRECTION

PATENT NO.   : 5,495,959
DATED        : March 5, 1996
INVENTOR(S)  : J. Brett Rolfson It is certified that error appears in the above-indentified patent and that said Letters Patent is hereby corrected as shown below:

Title page, item [54] and col. 1, line 1,
In the title:  should read--

METHOD OF MAKING SUBTRACTIVE RIM PHASE SHIFTING MASKS--.

Signed and Sealed this

Fourth Day of June, 1996

Attest:

BRUCE LEHMAN

*Attesting Officer*          *Commissioner of Patents and Trademarks*